(12) United States Patent
Horibata

(10) Patent No.: US 7,352,314 B2
(45) Date of Patent: Apr. 1, 2008

(54) DIGITAL-TO-ANALOG CONVERTER CIRCUIT

(75) Inventor: Hiroyuki Horibata, Gifu (JP)

(73) Assignee: Epson Imaging Devices Corporation (JP)

( * ) Notice: Subject to any disclaimer, the term of this patent is extended or adjusted under 35 U.S.C. 154(b) by 0 days.

(21) Appl. No.: 11/504,141

(22) Filed: Aug. 15, 2006

(65) Prior Publication Data

US 2007/0052568 A1 Mar. 8, 2007

(30) Foreign Application Priority Data

Aug. 16, 2005 (JP) ............................. 2005-235632

(51) Int. Cl.
*H03M 1/66* (2006.01)
(52) U.S. Cl. ...................... 341/150; 341/144
(58) Field of Classification Search ................ 341/144, 341/150, 172, 153
See application file for complete search history.

(56) References Cited

U.S. PATENT DOCUMENTS

| | | | | |
|---|---|---|---|---|
| 5,332,997 A | * | 7/1994 | Dingwall et al. | 341/150 |
| 6,046,719 A | * | 4/2000 | Dingwall | 345/100 |
| 6,081,218 A | * | 6/2000 | Ju et al. | 341/150 |
| 6,323,798 B1 | * | 11/2001 | Abe | 341/150 |
| 6,559,785 B2 | * | 5/2003 | Kuttner | 341/155 |
| 6,707,403 B1 | * | 3/2004 | Hurrell | 341/120 |
| 6,747,589 B2 | * | 6/2004 | Srinivasan et al. | 341/172 |
| 7,199,740 B1 | * | 4/2007 | Ferguson et al. | 341/144 |
| 2002/0121996 A1 | * | 9/2002 | Kuttner | 341/145 |

FOREIGN PATENT DOCUMENTS

JP     2003-029725     1/2003

* cited by examiner

*Primary Examiner*—Linh Nguyen
(74) *Attorney, Agent, or Firm*—McCarter & English, LLP

(57) ABSTRACT

Data of a zero$^{th}$ bit is supplied via a charge control transistor for the zero$^{th}$ bit to a corresponding capacitor, data of a first bit is supplied via a charge control transistor for the first bit to a corresponding capacitor, and data of a second bit is supplied via a charge control transistor for the second bit to a corresponding capacitor. The capacitors for the zero$^{th}$ bit, first bit, and second bit have capacitances which are set in a ratio of 1:2:4 and capabilities of the corresponding charge control transistors for respective bits are set in a ratio of 1:2:4. With this structure, charging of capacitors corresponding to the bits can be performed under similar conditions.

3 Claims, 15 Drawing Sheets

DIGITAL-TO-ANALOG CONVERTER CIRCUIT

PRIORITY INFORMATION

The entire disclosure of Japanese Patent Application No. 2005-235632 filed on Aug. 16, 2005 is expressly incorporated by herein reference.

BACKGROUND OF THE INVENTION

1. Field of the Invention

The present invention relates to a digital-to-analog converter circuit which uses a capacitance ratio of capacitors.

2. Description of the Related Art

Conventionally, flat panel display devices such as liquid crystal display devices are commercialized. In particular, a small size, light weight display device is necessary for a portable device, and, for example, a liquid crystal display device is primarily used in a portable phone or the like.

In the liquid crystal display device, because high resolution images are also displayed, an active matrix type liquid crystal display device is used which has a pixel circuit in each display pixel and which can display a high-resolution image.

In a liquid crystal display device, a data voltage corresponding to the brightness is applied to the liquid crystal to realize a display. Therefore, the data signal supplied to each pixel is an analog signal. On the other hand, it is often preferable that the video signal to be supplied to the liquid crystal display device be a digital video signal. In such a case, a digital-to-analog conversion process is applied in the liquid crystal display device and an analog data signal is then supplied to each pixel.

In a digital-to-analog conversion circuit, the power supply voltage is resistively divided and a voltage corresponding to a value of the digital data is generated. However, with an increase in the number of bits of the digital data, the number of stages of resisters is also increased, the voltage value for each stage is reduced, and thus it is difficult to maintain precision for the voltage value. Digital-to-analog converter circuits are known in which a capacitance ratio of capacitors is set based on weights of bits of digital data, a voltage corresponding to "1" and "0" of each bit is set at each capacitor, and a corresponding voltage is set as an output analog voltage by an amount of charge obtained in this manner.

With such a digital-to-analog converter circuit which uses the capacitance ratio, it is possible to easily obtain a relatively small voltage. Therefore, it may be considered preferable to carry out conversion of digital data of a large number of bits by combining the digital-to-analog converter circuit by resistive division and the digital-to-analog converter circuit which uses the capacitance ratio.

Japanese Patent Laid-Open Publication No. 2003-29725, for example, discloses a digital-to-analog conversion of a data signal.

In the digital-to-analog converter circuit which uses the capacitance ratio, it is necessary for charging to the capacitors to be accurately performed in order to improve the precision of the conversion. In a display device, however, video signals which are sequentially supplied must be processed in order, and thus there had been a problem in that the charging process of the capacitor cannot be performed sufficiently accurately.

SUMMARY OF THE INVENTION

According to one aspect of the present invention, there is provided a digital-to-analog converter circuit comprising a plurality of capacitors each provided corresponding to each bit of digital data and having different capacitances from each other which are determined based on weights of the corresponding bits, an output unit which outputs an analog voltage determined based on an amount of charge which is a total of charges charged to the plurality of capacitors and a total capacitance of the plurality of capacitors, and a charge control transistor which is provided on a route of the digital data to each of the plurality of capacitors and controls supply of a voltage for each bit to the capacitor. A size of the charge control transistor is set corresponding to the capacitance of the capacitor to which the charge control transistor is connected.

A transistor size of the charge control transistor is determined according to the capacitance of the corresponding capacitor. For example, in the first bit, the second bit, and the third bit from the LSB (least significant bit), the transistor sizes are set as 1, 2, and 4, respectively. With this setting, it is possible to secure a sufficient charge (current) supply capability to the capacitor in each bit and to more accurately perform the digital-to-analog conversion. In addition, it is possible to set the change of the voltage due to MOS capacitor in the charge control transistor to be identical.

BRIEF DESCRIPTION OF THE DRAWINGS

A preferred embodiment of the present invention will be described in detail by reference to the drawings, wherein.

DESCRIPTION OF THE PREFERRED EMBODIMENT

Figure 1:
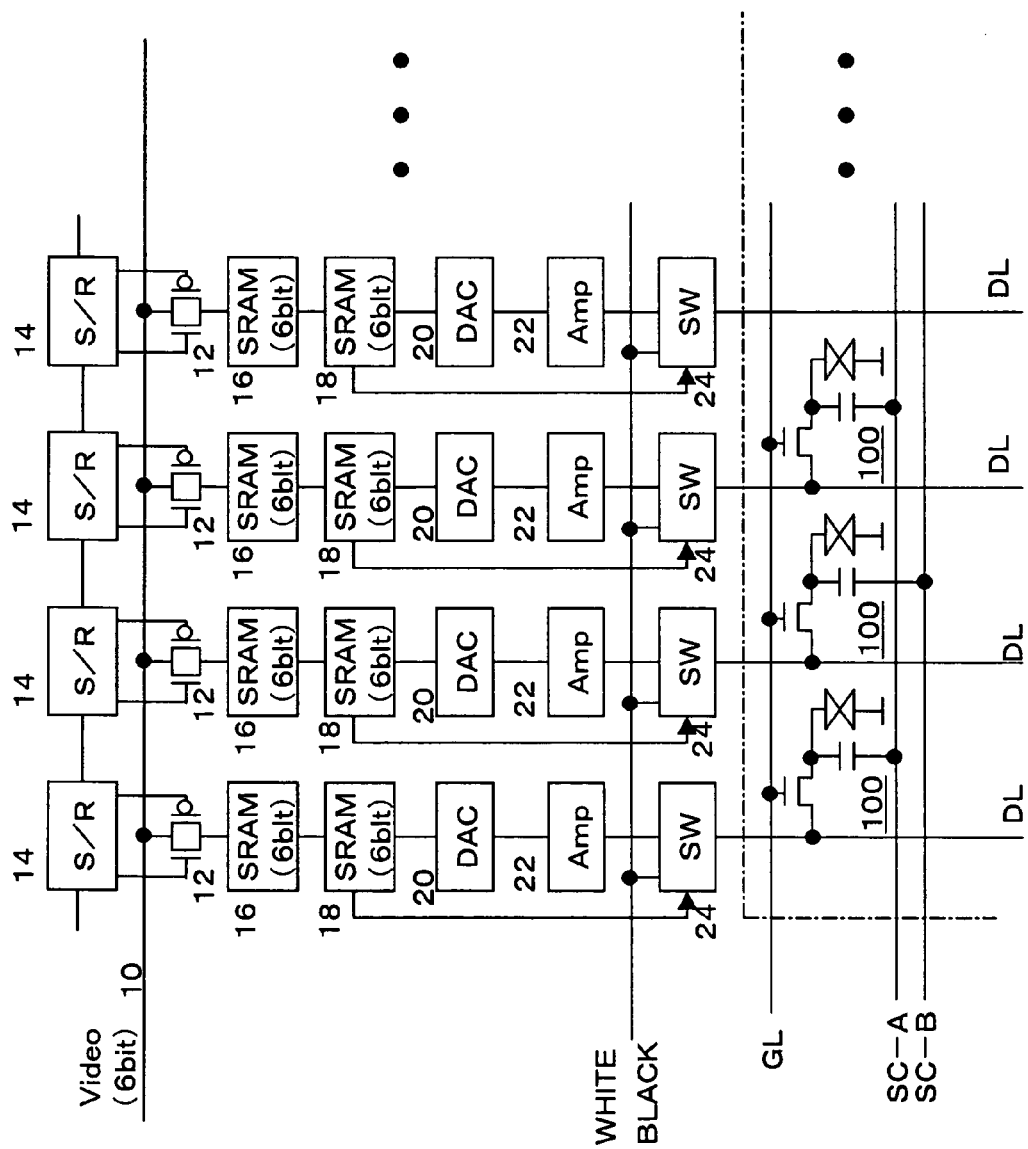
FIG. 1 is a diagram showing a structure for supplying video data to a pixel circuit in a liquid crystal display device according to a preferred embodiment of the present invention.

A preferred embodiment of the present invention will now be described referring to the drawings.

[Overall Structure]

FIG. 1 is a diagram showing a structure for supplying video data to a pixel circuit in a liquid crystal display device according to a preferred embodiment of the present invention.

In this embodiment, a video line 10 of 6 bits sequentially transfers a digital brightness signal of 64 levels (gradations) for each pixel according to a pixel clock. FIG. 1 shows only one color, although in reality, three video lines for R (red), G (green), and B (blue) are provided and video data for these colors are supplied to pixels of corresponding color in parallel.

An input terminal of a switch 12 provided corresponding to each column of pixels is connected to the video line 10. An output of a horizontal transfer register 14 is connected to control terminals of the switch 12. The horizontal transfer register 14 sequentially transfers a horizontal start signal (STH) using a pixel clock which is synchronized with timing of each pixel of video data supplied on the video line, and has a register corresponding to each column of pixels. In this description, because display of color of one of R, G, and B is described, the display bit and the pixel are identical. The transfer clock supplied to the horizontal transfer register has a period which is twice that of the normal pixel clock and two clocks (CKH and XCKH) having phases inverted from each other are typically used.

When video data for pixels of a first column is being supplied on the video line 10, the horizontal start signal STH is read by the first horizontal transfer register 14 and a corresponding switch 12 is switched ON. As a result of the horizontal start signal (STH) being sequentially transferred among the horizontal transfer registers 14 according to the pixel clock, the switches 12 corresponding to the pixel are sequentially switched ON for video data for each pixel supplied on the video line 10. The switch 12 is formed by connecting a p-channel transistor (TFT) and an n-channel transistor (TFT) in parallel, and each of the transistors is simultaneously switched on or off by a non-inverted output and an inverted output of one register of the horizontal transfer registers 14.

An input terminal of an SRAM 16 of 6 bits is connected to an output terminal of each switch 12 and an input terminal of an SRAM 18 of 6 bits is connected to an output terminal of the SRAM 16. Therefore, the video data for each pixel sequentially supplied on the video line 10 is read by the corresponding SRAM 16 by the switches 12 being sequentially switched ON. When video data for one line (one horizontal scan line) are read by the SRAMs 16, video data for one line are simultaneously transferred to the corresponding SRAMs 18, and these processes are repeated for each horizontal scan period. Therefore, in each horizontal scan period, video data of one line are read by the SRAM 16, the video data is then transferred to the SRAM 18, the transferred video data is maintained by the SRAM 18 for the next horizontal scan period, and the video data is output from the SRAM 18. These operations are repeated.

An input terminal of a digital-to-analog converter (DAC) 20 is connected to an output terminal of the SRAM 18. The DAC 20 converts the video data of 6 bits supplied from the SRAM 18 into an analog video signal of 64 levels. The DAC 20 outputs video signals of two types of polarities (two polarities which are opposite in the application direction of voltage with respect to the liquid crystal with a potential on a common electrode of the liquid crystal element as a reference voltage) in order to apply an AC driving process in which the application direction of voltage to the liquid crystal is periodically changed at a predetermined period. As will be described later, in the present embodiment, a dot-inversion method is employed as the method of AC driving. Because of this, the direction of the voltage (polarity) to be applied to the liquid crystal is inverted for pixels adjacent along the horizontal or vertical direction and the liquid crystal of a pixel is inverted every frame.

An input terminal of an amplifier (Amp) 22 is connected to an output terminal of each DAC 20 and an output terminal of the amplifier 22 is connected to a data line DL via a switching switch 24. The data line DL extends along the column direction (vertical scan direction) and pixel circuits 100 of the corresponding column are connected to the data line DL. In the illustrated structure, because a source of a pixel TFT in the pixel circuit 100 is connected to the data line DL, the data line DL may also be referred to as a "source line".

Thus, when the analog video signal output from the DAC 20 is supplied to the data line DL and the pixel circuit 100 of the corresponding row reads the analog video signal, display is realized in each pixel according to the read analog video signal.

[Structure of SRAM]

In the present embodiment, two SRAMs 16 and 18 which store digital video data of 6 bits are provided for each column. The video data has a dynamic range which is set relatively small. There is a demand to increase the dynamic range as the data to be input to the DAC 20. In consideration of this, the level of a 5V amplitude is shifted to the level of an 8V amplitude.

In the present embodiment, a latch circuit and a level shifter are combined to form the SRAM 16 so that the level shifting is performed in the SRAM 16.

Figure 2:
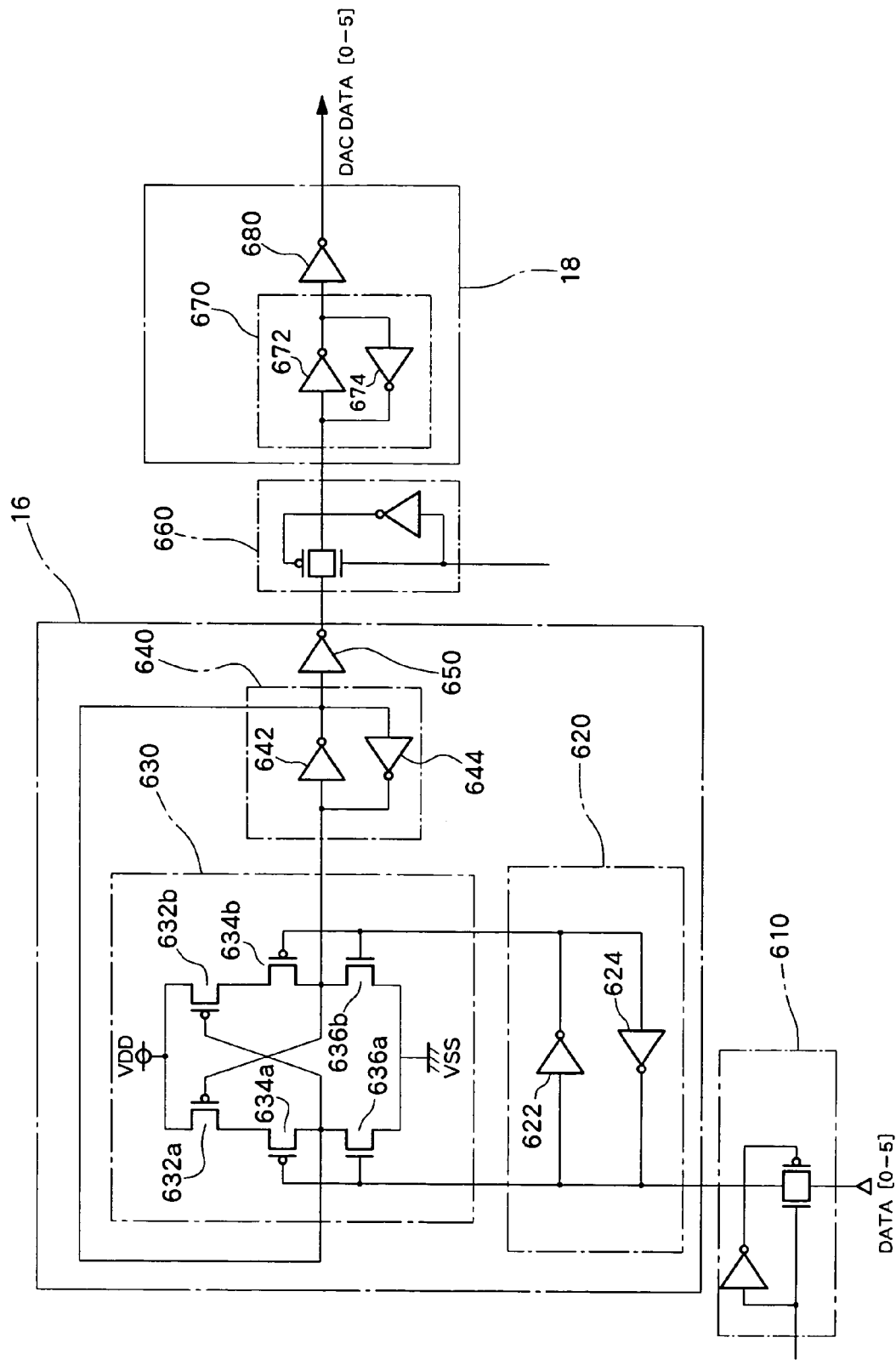
FIG. 2 is a diagram showing a structure of a latch-type level shift circuit (SRAM 16) and a structure of a latch circuit (SRAM 18) which latches an output of the SRAM 16.

FIG. 2 shows a structure of a latch-type level shift circuit (SRAM 16) and a latch circuit which latches an output of the SRAM 16 (SRAM 18); Here, the video data is digital data of 6 bits, and only the video data for 1 bit is shown.

Digital video data having an amplitude of 5V is supplied to a switch 610. The switch 610 is controlled by a clock which is synchronized with the dot clock and reads the video data supplied on an input terminal for every display pixel (dot). For example, when the corresponding switch 12 on the video line 10 in FIG. 1 is switched on, the switch 610 is switched on and video data is read. The switch 610 may be employed as the switch 12.

A first latch 620 is connected to an output terminal of the switch 610. The first latch 620 has an amplitude of 5V and comprises two inverters 622 and 624 which operate at 5V and have the input and output terminals connected. In the exemplified configuration, because an output from the switch 610 is supplied to an input side of the inverter 622, an inverted signal is input to the inverter 624. Therefore, the state of the input of the inverter 622 is determined based on the state of the output of the switch 610 and the state of the pair of output sides of the inverter 622 is also determined based on the state of the output of the switch 610.

In the exemplified configuration, it is preferable that the capability of the inverter 622 be superior compared to that of the inverter 624. With such a configuration, even when the video data which is input is inverted, the output of the inverter 622 can be easily inverted and the data can be latched.

A pair of outputs (having opposite polarities) of the first latch 620 is input to a voltage-driven level shifter 630. The level shifter 630 has a structure in which two series connections of three transistors are connected in parallel between VDD which is 8V and VSS which is 0V.

A series connection of a p-channel TFT 632a, a p-channel TFT 634a, and an n-channel TFT 636a and a series connection of a p-channel TFT 632b, a p-channel TFT 634b, and an n-channel TFT 636b are connected between VDD and VSS. An output of the switch 610 latched by the latch circuit 620 is supplied to gates of the TFT 634a and TFT 636a and an inverted signal of the output of the switch 610 latched by the latch circuit 620 is supplied to gates of the TFT 634b and TFT 636b. A gate of the TFT 632a is connected to an intermediate point between the TFT 634b and the TFT 636b and a gate of the TFT 632b is connected to an intermediate point between the TFT 634a and the TFT 636a.

With this structure, one of the gate of the TFT 632a, which is at the intermediate point between the TFT 634b and the n-channel TFT 636b, and the gate of the TFT 632b, which is at the intermediate point between the TFT 634a and the n-channel TFT 636a, becomes an H level, and the other one of the gate of the TFT 632a and the gate of the TFT 632b becomes an L level depending on the output of the latch 620. For example, when the output of the switch 610 is H level ("1"), the intermediate point between the TFT 634b and the n-channel TFT 636b becomes the H level and the intermediate point between the TFT 634a and the n-channel TFT 636a becomes the L level.

The output from the intermediate point between the TFT 634b and the n-channel TFT 636b and the output from the intermediate point between the TFT 634a and the n-channel TFT 636a are input to a second latch 640. The second latch 640 comprises an inverter 642 and an inverter 644 connected to each other. An output of the intermediate point between the TFT 634b and the n-channel TFT 636b is input to the input of the inverter 642, an output of the intermediate point between the TFT 634a and the TFT 636a is input to the input of the inverter 644, and an output of the inverter 642 (input of the inverter 644) is the output of the second latch 640.

Therefore, the data input to the switch 610 is latched by the first latch 620 and a signal having a level shifted by the level shifter 630 and a signal having a level shifted and which is inverted are latched by the second latch 640 as a signal of 8V. The first latch 620, level shifter 630, and second latch 640 form the SRAM 16. Therefore, a signal having the level shifted from the 5V amplitude to the 8V amplitude is obtained at the output of the SRAM 16. In this manner, by providing the latch circuits at the input side and the output side of the level shifter 630, the latch operation and the level shift operation can be simultaneously performed. Therefore, the power consumption can be reduced compared to a configuration in which the latch operation and the level shift operation are performed separately.

The output of the second latch 640 is inverted by an inverter 650. In comparison with the structure of FIG. 1, the structures up to the inverter 650 correspond to the SRAM 16. The input video data is stored in the SRAM 16 according to the dot clock, the level of the input video signal is shifted by the SRAM 16, and the video data is output from the SRAM 16.

An output of the inverter 650 is supplied to a latch 670 via a switch 660. The switch 660 is opened for a predetermined period after data of one horizontal scan line is read by the SRAM 16. The latch 670 comprises an inverter 672 and an inverter 674 having inputs and outputs connected. An output of the switch 660 is input to the inverter 672 and an output of the inverter 672 becomes an output of the latch 670. The output of the latch 670 is inverted by an inverter 680 and is output. Therefore, the latch 670 and the inverter 680 form the SRAM 18. In other words, in one horizontal scan line, the switch 660 is opened when the video data for each pixel is stored in each SRAM 16 and the video data at that point is set in the SRAM 18. For example, data of all SRAMs 16 are transferred to the SRAM 18 at once in a horizontal return period (blanking period).

In this manner, according to the present embodiment, the level shift process can be applied by the SRAM 16 when the SRAM 16 stores data, and thus an efficient operation can be achieved.

[Structure of Upper Bit Conversion of DAC 20]

Figure 3:
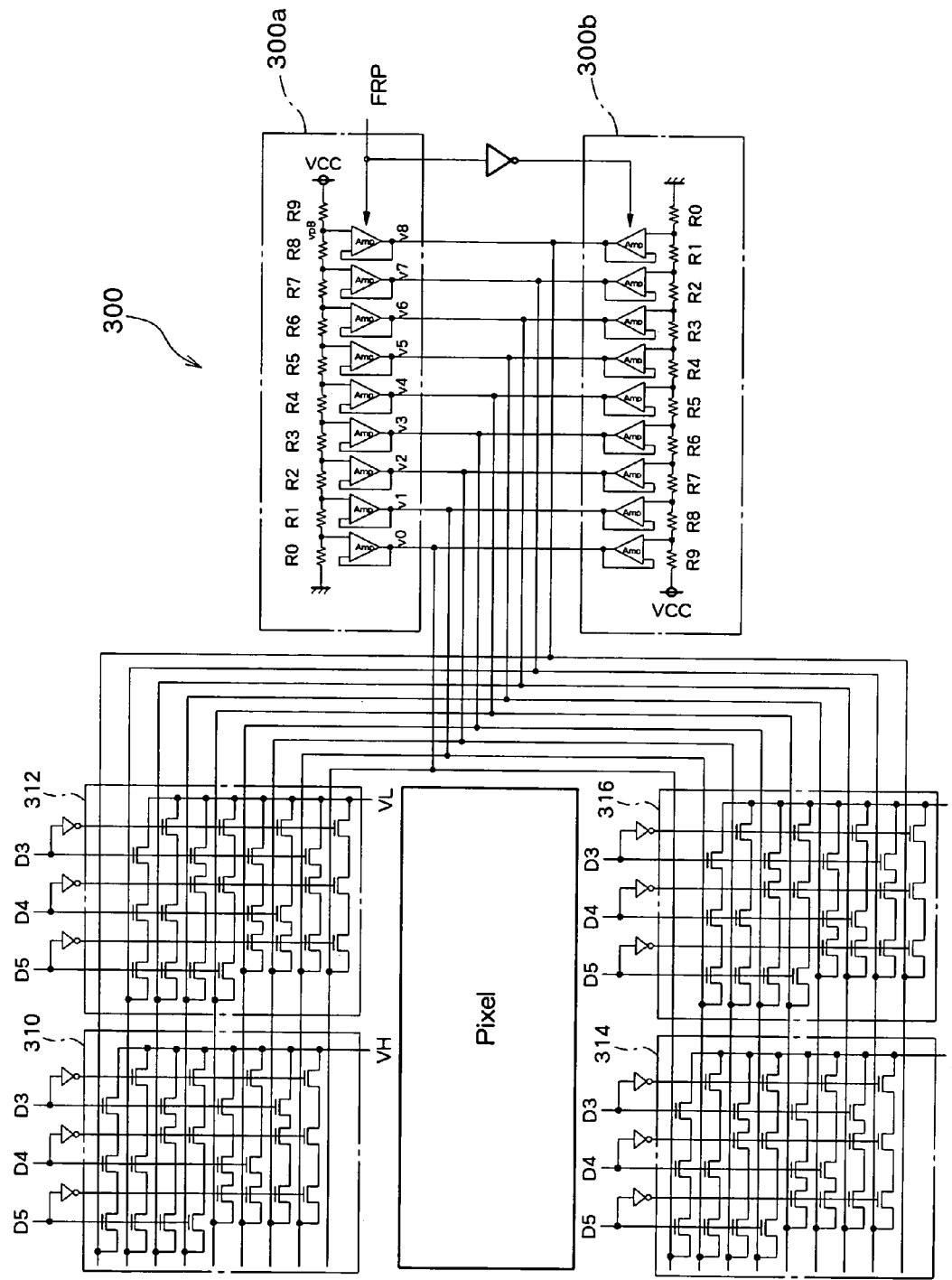
FIG. 3 is a diagram showing a structure of an upper bit conversion of a DAC 20.

FIG. 3 shows a structure of an upper bit conversion of the DAC 20. A reference voltage generating circuit 300 comprises two reference voltage amplifiers 300a and 300b. In both of the reference voltage amplifiers 300a and 300b, 10 resistors R0-R9 are provided between a power supply voltage VCC and GND for resistive division and 9 reference voltages v0-v8 are generated. The reference voltage amplifiers 300a and 300b alternately operate for one horizontal scan period. Therefore, the 9 reference voltages v0-v8 have the polarities inverted every horizontal period. In other words, when the reference voltage amplifier 300a is operating, v8 is a voltage close to VCC and v0 is a voltage close to GND, and when the reference voltage amplifier 300b is operating, this relationship is reversed. The switching between reference voltage amplifiers 300a and 300b at every horizontal period is realized by a signal FRP. For example, the reference voltage amplifier 300a operates when the signal FRP is at H level and the reference voltage amplifier 300b operates when the signal FRP is at L level.

Data D5-D3 are input to four decoders including an upper H side decoder 310, an upper L side decoder 312, a lower H side decoder 314, and a lower L side decoder 316 and reference voltages v0-v8 are supplied to the decoders 310-316. The upper H side decoder 310 selects and outputs one of the reference voltages v8-v1 according to 8 values of 111-000 of the data D5-D3 and the upper L side decoder 312 selects and outputs one of the reference voltages v7-v0 according to 8 values of 111-000 of the data D5-D3. Therefore, an output VH of the upper H side decoder 310 is higher than an output VL of the upper L side decoder 312 by one level (when v8 is at a side near the VCC). Similarly, the lower H side decoder 314 selects and outputs one of the reference voltages v0-v7 according to 8 values of 111-000 of the data D5-D3 and the lower L side decoder 316 selects and outputs one of the reference voltages v1-v8 according to 8 values of 111-000 of the data D5-D3. Thus, an output VH of the lower H side decoder 314 is higher than an output VL of the lower L side decoder 316 by one level (when v8 is at a side near VCC).

As described above, the upper decoders 310 and 312 output the output voltages VH and VL which are shifted by a voltage corresponding to the bit of D3. The lower decoders 314 and 316 similarly output the voltages VH and VL which differ from each other by one bit of D3, but the polarity (a direction of change of whether the output analog signals VH and VL are larger or smaller compared to a direction of change of input digital data becoming larger or smaller) of the outputs VH and VL of the lower decoders 314 and 316 are opposite to those of the upper decoders 310 and 312.

When the outputs of the upper decoders 310 and 312 are to be supplied to data line DL of an odd column, the outputs of the lower decoders 314 and 316 are supplied to the data line DL of an even column.

In this manner, with the upper decoders 310 and 312 and the lower decoders 314 and 316 inverting the supply of the reference voltage, it is possible to execute the digital-to-analog conversion process in decoders at the upper side of the panel and at the lower side of the panel using single reference voltage generating circuit 300. Therefore, by alternately supplying the outputs of the upper decoders 310 and 312 and lower decoders 314 and 316 on the data line DL, it is possible to invert the polarity of the video signal for each data line DL. Moreover, by alternately using the reference voltage amplifiers 300a and 300b every horizontal line, it is possible to change the polarity of the video signal to be supplied to the data lines DL every horizontal scan line. Thus, it is possible to realize dot inversion driving in a liquid crystal display device. When such a dot inversion driving process is applied, the number of the reference voltage generating circuits 300 can be reduced to 1, and therefore, the circuit can be simplified and the power consumption can be reduced.

[Structures of Lower Bit Conversion of DAC 20 and Amplifier 22]

Figure 4:
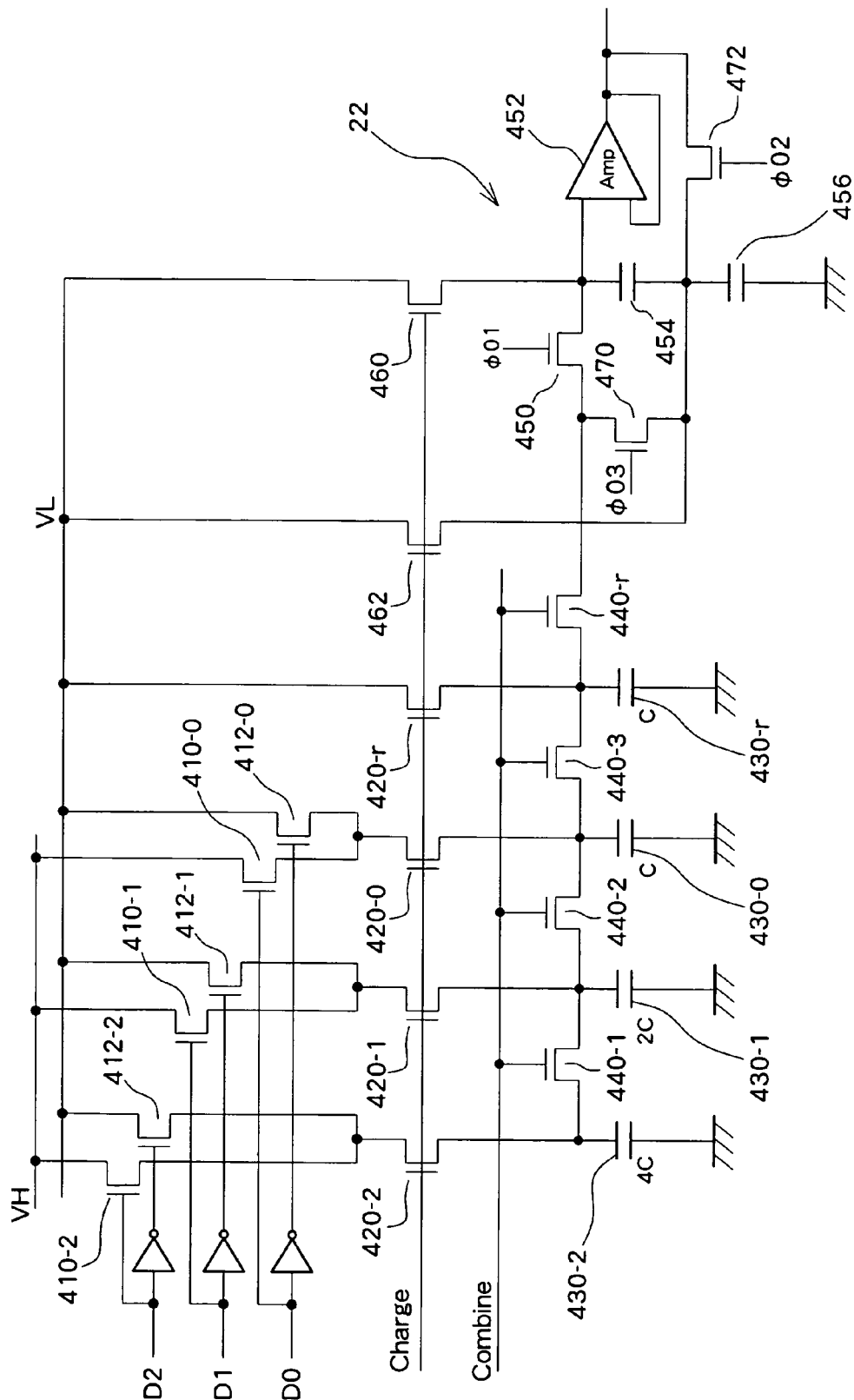
FIG. 4 is a diagram showing a structure of a lower bit conversion of a DAC 20.

As described above, when the voltages VH and VL are obtained from the upper 3 bits (D5-D3), 8 types of voltages corresponding to D2-D0 are obtained for a voltage of the difference between VH and VL. FIG. 4 shows a structure for this process. D2 is input to a gate of a TFT 410-2 without any processing and is input to a gate of a TFT 412-2 with inversion. The voltage VH is supplied to one terminal of the TFT 410-2 and the voltage VL is supplied to one terminal of the TFT 412-2. The other terminals of the TFTs 410-2 and 412-2 are connected to one terminal of a capacitor 430-2 via a charge control TFT 420-2. The other terminal of the capacitor 430-2 is connected to the ground.

Thus, when D2 is at the H level ("1"), the TFT 410-2 is switched ON and VH is selected. When the charge control TFT 420-2 is ON, the capacitor 430-2 is charged to VH. When, on the other hand, D2 is at the L level ("0"), the capacitor 430 is charged to VL.

Structures similar to those for D2 are provided for D1 and D0. Therefore, corresponding capacitors 430-1 and 430-0 are charged to VH or VL according to the values of D1 and D0, respectively.

In addition, a charge control TFT 420-r is provided which directly charges the corresponding capacitor 430-r to VL regardless of the data. The charge control TFTs 420-r, 420-0, 420-1, and 420-2 are switched ON and OFF by a signal Charge.

Capacitances of the capacitors 430-r, 430-0, 430-1, and 430-2 are set as C, C, 2C, and 4C. C is, for example, 0.5 pF, in which case 4C is 2 pF.

The upper terminals of the capacitors 430-r, 430-0, 430-1, and 430-2 are connected by three coupling TFTs 440-1, 440-2, and 440-3 and the upper terminal of the capacitor 430-r is set as an output terminal via a TFT 440-r.

A signal Combine is supplied to gates of the coupling TFTs 440-1, 440-2, and 440-3 and TFT 440-r.

In this circuit, when all of D2-D0 are "0", all of the capacitors 430-2, 430-1, 430-0 and 430-r are charged to VL, and thus the output voltage is VL. As described above, VL is selected by D5-D3 and is a voltage designated by D5-D0.

When D0 is "1", the capacitor is charged with an additional charge of (VH−VL)·C, a voltage which is obtained by multiplying the charge by ⅛C is added to VL, and VL+(VH−VL)/8 is output. When D2 is "1", the capacitor is charged with an additional charge of (VH−VL)·4C, a voltage which is obtained by multiplying the charge by ⅛C is added to VL, and VL+4(VH−VL)/8 is output. When all of D0, D1, and D2 are "1", a voltage of VL+7(VH−VL)/8 is output. Therefore, a voltage employing (VH−VL) as a unit is added to VL depending on the values of D0-D3 and a voltage corresponding to the values of D5-D0 is obtained at the output.

The voltage obtained at the output is a voltage between VCC and GND, has the polarity inverted at the upper side and lower side of the panel (even and odd columns), and has the polarity inverted every horizontal period.

In the present embodiment, the sizes of the charge control TFTs 420-r, 420-0, 420-1, and 420-2 are set in a ratio of 1:1:2:4. More specifically, the capacitors 430-r, 430-0, 430-1, and 430-2 to be charged by the charge control TFTs 420-r, 420-0, 420-1, and 420-2 have the ratio of capacitances of 1:1:2:4 and the amounts of current to be supplied by the charge control TFTS 420-r, 420-0, 420-1, and 420-2 correspond to this ratio. Therefore, by setting the sizes of the charge control TFTs 420-r, 420-0, 420-1, and 420-2 in the ratio of 1:1:2:4 as in the present embodiment, the amount of charges to be charged to the corresponding capacitors 430-r, 430-0, 430-1, and 430-2 can be accurately set to capacitance x voltage, and an accurate output voltage can be obtained. In addition, it is possible to set the change in voltage due to a MOS capacitance in the transistor (charge control TFT) to be identical.

[Structure of Amplifier 22]

A first example configuration of the amplifier 22 will now be described referring to FIG. 4. The amplifier 22 has a structure for correction of the output. An output from the coupling TFT 440-r is input to a buffer amplifier 452 via a switch TFT 450 which is switched ON and OFF by a signal φ01. In addition, one terminal of a correction capacitor 454 is connected to an input terminal of the buffer amplifier 452 and another terminal of the correction capacitor 454 is connected to a ground GND via a voltage drop control capacitor 456.

A voltage VL is supplied to the input terminal of the buffer amplifier 452 via a TFT 460 which is switched ON and OFF by the charging signal Charge. A voltage VL is supplied to an intermediate point between the capacitors 454 and 456 by a TFT 462 which is switched ON and OFF by the charging signal Charge, an input side of the switch TFT 450 (output terminal of the DAC) is connected to the intermediate point between the capacitors 454 and 456 by a TFT 470 which is switched ON and OFF by a signal φ03, and an output terminal of the buffer amplifier 452 is connected to the intermediate point between the capacitors 454 and 456 via a TFT 472.

Figure 5A:
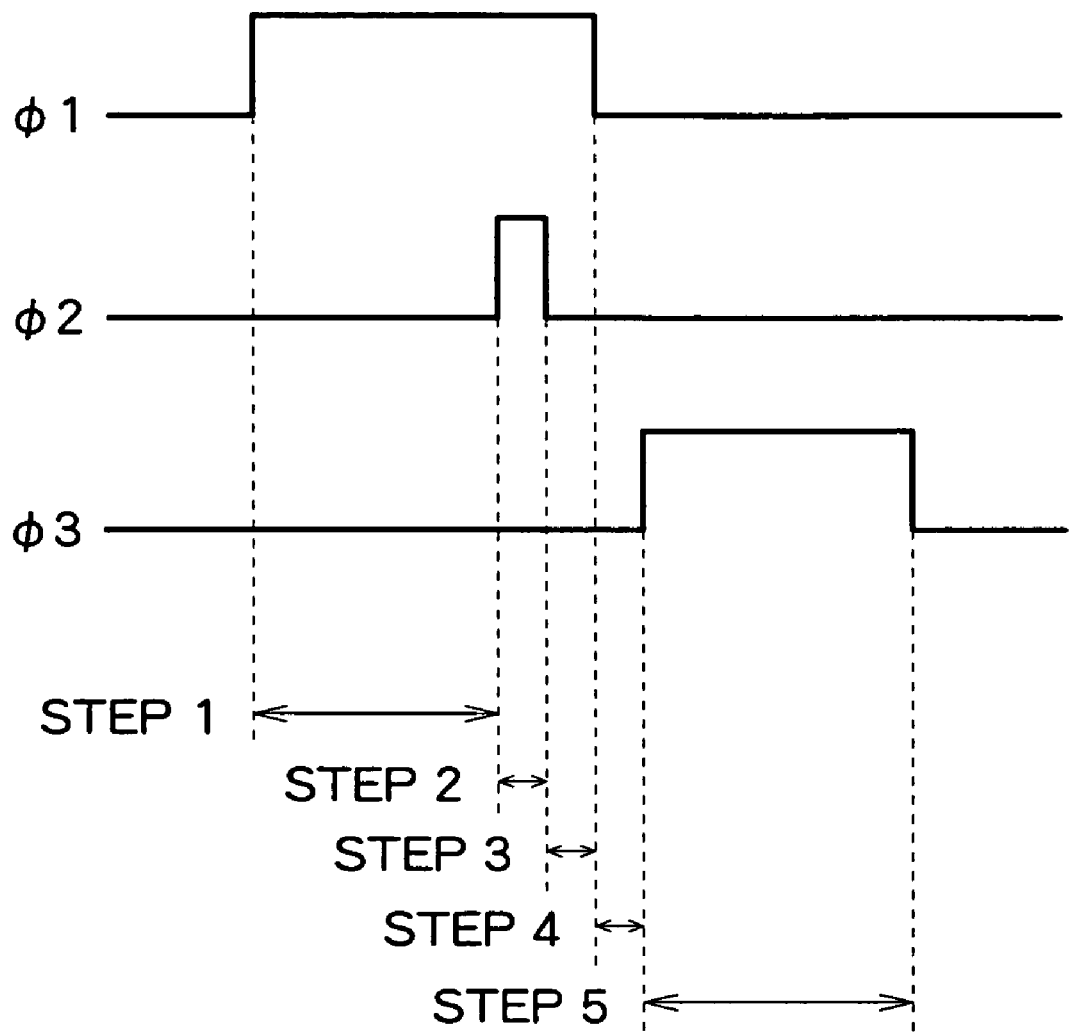
FIG. 5A is a diagram for explaining an operation of a circuit of an amplifier 22.
Figure 5B:
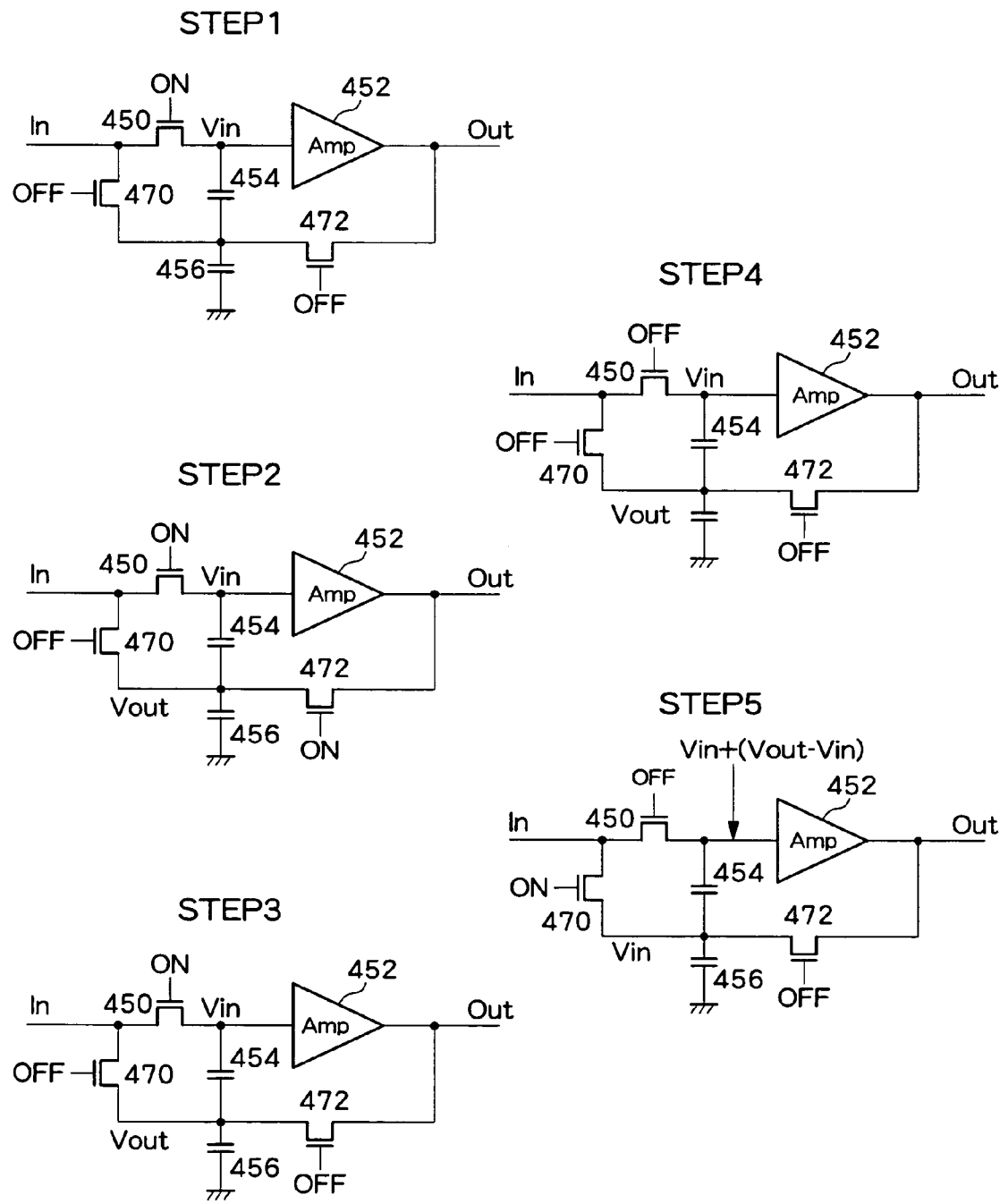
FIG. 5B is a diagram for explaining an operation of a circuit of an amplifier 22.

An operation of such a circuit will now be described referring to FIGS. 5A and 5B. First, the TFTs 460 and 462 are switched ON by the signal Charge, and the input terminal of the buffer amplifier 452 and the intermediate point between the capacitors 454 and 456 are set to the voltage VL. In addition, in this state, the capacitors 430-r, 430-0, 430-1, and 430-2 are charged in a manner described above and the amount of charge is determined. The signal Charge then falls and the signal Combine rises, and an analog voltage Vin corresponding to the input data appears on the output terminal of the DAC 20.

In step 1, the signal φ01 is set to the H level while the signal Combine is at the H level and the switch TFT 450 is switched ON. When the switch TFT 450 is switched ON, the input terminal of the buffer amplifier 452 is set to the output voltage Vin of the DAC 20.

Next, in step 2, a signal φ02 is set to the H level so that the TFT 472 is switched ON. When the TFT 472 is switched ON, the intermediate point between the capacitors 454 and 456 is set to an output voltage Vout of the buffer amplifier 452. The buffer amplifier 452 operates to match the output voltage to the input voltage. However, due to the characteristics of the buffer amplifier, a deviation is created, and thus, in the present embodiment, the deviation is compensated. When the deviation voltage is □V in the buffer amplifier 452, the output voltage Vout can be represented as Vout=Vin+□V.

In step 3, the signal φ02 is returned to the L level. With this process, a side (upper side) of the capacitor 454 near the input terminal of the buffer amplifier 452 is fixed to Vin, a side (lower side) of the capacitor 454 near the capacitor 456 is fixed to Vout, and the capacitor 454 is charged with □V.

In step 4, the signal φ01 is set to the L level and the switch TFT 450 is switched OFF. When the switch TFT 450 is switched OFF, the gate potential changes from the H level to the L level, and due to the gate capacity (Cgs) of the switch TFT 450, the voltage on the input terminal of the buffer amplifier 452 is slightly reduced. Here, the capacitor 454 is charged to □V and the capacitor 456 is charged to Vout— GND. Therefore, the voltage on the intermediate point of the capacitors 454 and 456 and the voltage on the input terminal of the buffer amplifier 452 cannot change significantly. When the amount of reduction of the voltage on the input terminal of the buffer amplifier 452 due to the switch TFT 450 being switched OFF is a, the voltage on the input terminal of the buffer amplifier 452 is Vin—a. The voltage on the intermediate point between the capacitors 454 and 456 is reduced according to the voltage a, although the amount of reduction is smaller than the voltage a. When the reduction of voltage on the intermediate point between the capacitors 454 and 456 is a', the voltage on the intermediate point between the capacitors 454 and 456 is Vin+□V−a'.

In step 5, the signal φ03 is set to the H level and the voltage on the intermediate point between the capacitors 454 and 456 is set to Vin. Thus, the voltage on the intermediate point between the capacitors 454 and 456 changes by an amount of Vin−(Vin+□V−a'), and therefore the input voltage on the buffer amplifier 452 also changes by the same amount and becomes Vin−a+Vin−Vin−□V+a', or, Vin−□V−(a−a'). Although the values for a and a' depend on the setting of the capacitances of the capacitors 454 and 456, these values are generally close and can easily be set to values almost identical to each other. Therefore, assuming that a=a', the input voltage of the buffer amplifier 452 becomes approximately Vin−□V. Thus, the output of the buffer amplifier 452 which is Vout=Vin+□V when Vin is input is now Vout approximately equaling Vin (Vout~Vin) because the input is reduced by approximately □V, and the deviation is compensated.

[Another Example Structure of Amplifier 22]

Figure 5C:
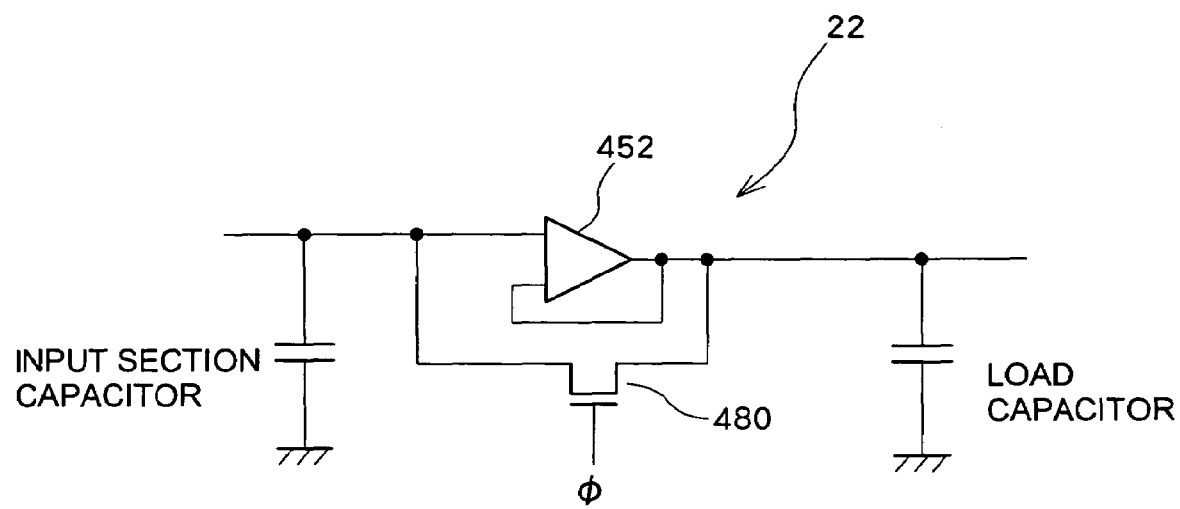
FIG. 5C is a diagram showing another example circuit for resolving an output deviation of the buffer amplifier 452 in the amplifier 22.

FIG. 5C shows another circuit example circuit structure for resolving the output deviation of the buffer amplifier 452 in the amplifier 22.

[Example Structure of Amplifier 22]

FIG. 5C exemplifies a circuit for resolving an output error in a buffer amplifier 452 in the amplifier 22.

In the exemplified configuration, the output of the DAC 20 is supplied to an input terminal of the buffer amplifier 452 without processing and a switch TFT 480 is provided which connects an output and an input of the buffer amplifier 452. The buffer amplifier 452 has the output and a negative input terminal connected (short-circuited) to each other and the input signal is input to a positive input terminal.

After the signal Combine is set to the H level and a corresponding voltage is output from the buffer amplifier 452 for a predetermined time, a signal φ_is set to the H level so that a switch TFT 480 is switched ON. With this process, the voltage on the output side of the buffer amplifier 452 can be set closer to the voltage of the input side and the error in the output of the buffer amplifier 452 can be reduced.

As shown in FIG. 5C, a capacitor of the DAC is connected to the input side of the buffer amplifier 452, which forms an input section capacitor. Because the output of the buffer amplifier 452 is connected to the data line DL, there is a capacitor of the data line DL as a load capacitor. It is effective to switch the switch 480 ON after the load capacitor is sufficiently charged. In addition, it is preferable that the ratio of (load capacitance)/(input capacitance) between the load capacitor and the input section capacitor is 1 or less because such a ratio allows a larger effect due to the switching ON of the switch TFT 480. Moreover, a gate capacitor CS of the switch TFT 480 is preferably smaller than the input section capacitor and the load capacitor, and is preferably ⅒ or less with respect to these capacitors.

[Another Structure for Lower Bits of DAC 20]

Figure 6:
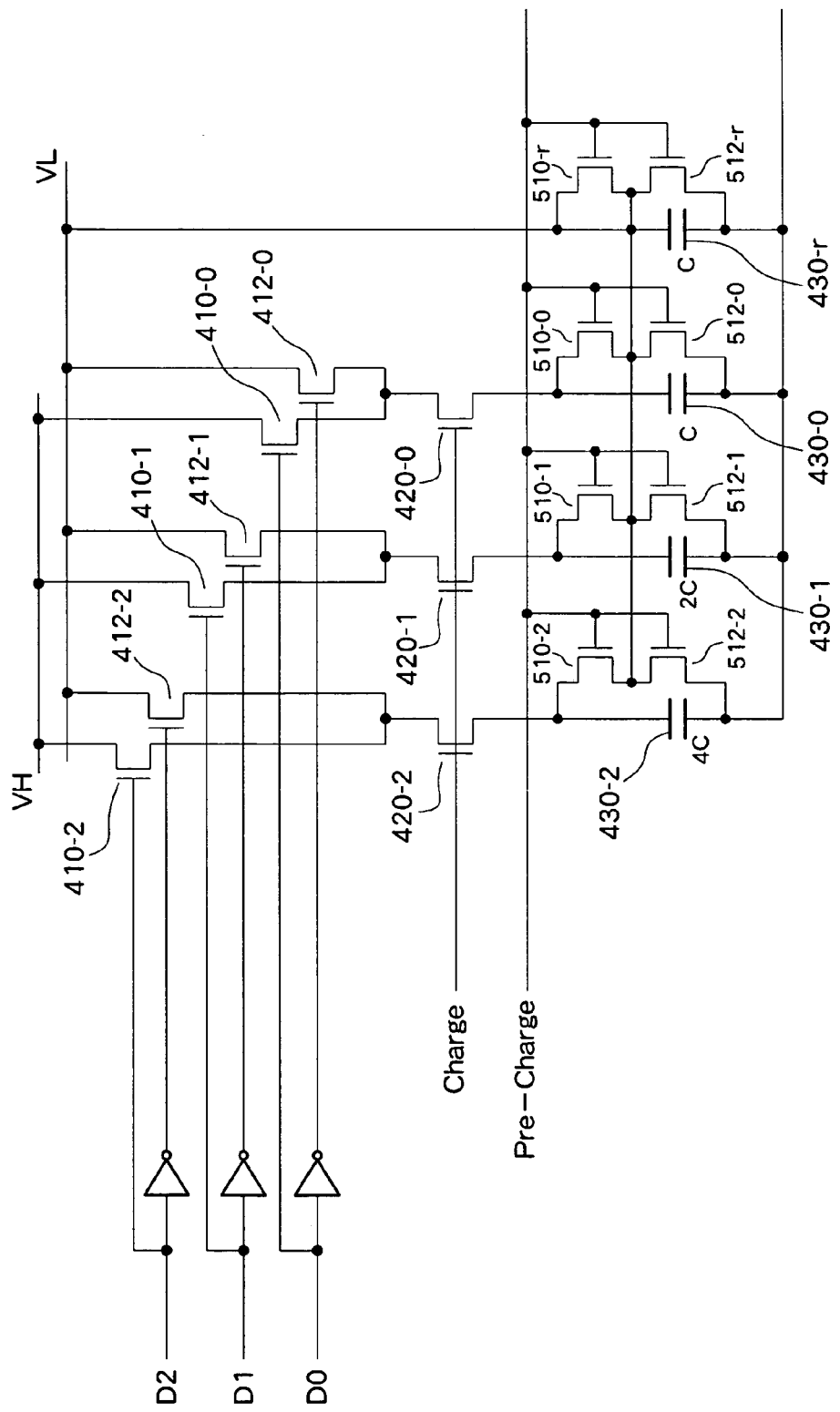
FIG. 6 is a diagram showing another example structure regarding the lower bits of the DAC 20.

FIG. 6 shows an alternate structure for the lower bits of the DAC 20. In this example structure, a signal Pre-Charge is used in place of the signal Combine.

TFTs 410-2, 412-2, 410-1, 412-1, 410-0, and 412-0 are provided corresponding to D2-D0, VH or VL is selected, and the selected voltage is supplied to one terminal (upper side) of each of the capacitors 430-2, 430-1, and 430-0 via each of the charge control transistors 420-2, 420-1, and 420-0, respectively. VL is directly supplied to the capacitor 430-r and one terminal (upper side) of the capacitor 430-r is always set at VL.

The other terminals (lower side) of the capacitors 430-2, 430-1, 430-0, and 430-r are connected to each other and form an output of the DAC 20.

A series connection of TFTs 510-2 and 512-2 is connected between the terminals of the capacitor 430-2, a series connection of TFTs 510-1 and 512-1 is connected between the terminals of the capacitor 430-1, a series connection of TFTs 510-0 and 512-0 is connected between the terminals of the capacitor 430-0, and a series connection of TFTs 510-r and 512-r is connected between the terminals of the capacitor 430-r. VL is supplied to the intermediate point in the series connection of the TFTs 510-2 and 512-2, the intermediate point in the series connection of the TFTs 510-1 and 512-1, the intermediate point in the series connection of the TFTs 510-0 and 512-0, and the intermediate point in the series connection of the TFTs 510-r and 512-r. In addition, the signal Pre-Charge is supplied to gates of all of these TFTS.

In such a circuit, first, the signal Pre-Charge is set to the H level so that both terminals in the capacitors 430-2, 430-1, 430-0, and 430-r are set to VL.

After the signal Pre-Charge is set to the L level, the charge control TFTs 420-2, 420-1, and 420-0 are switched ON to supply VH or VL corresponding to the data of D2-D0 to one terminal of each of the corresponding capacitors 430-2, 430-1, and 430-0. With this process, the other terminal of the capacitors 430-2, 430-1, and/or 430-0 to which VH is supplied attempts to shift. However, because the amount of charge in each capacitor is proportional to the capacitance ratio of the capacitors 430-2, 430-1, and 430-0, the voltage at the output terminal becomes a voltage which is shifted from VL toward the VH direction by an amount corresponding to a value determined by D2-D0, similar to the above-described structure.

In this structure also, the charge control TFTs 420-2, 420-1, and 420-0 are formed in transistor sizes corresponding to the ratio of capacitances of the capacitors 430-2, 430-1, and 430-0.

[Switching Switch 24]

Figure 7:
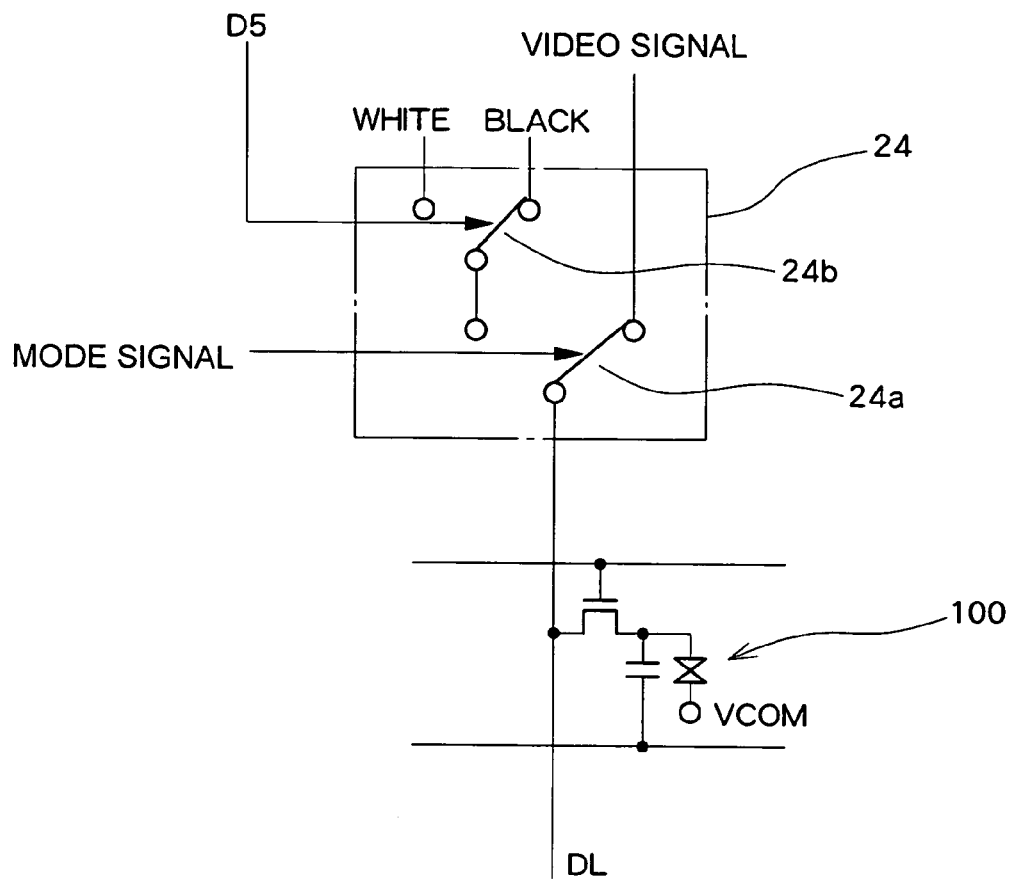
FIG. 7 is a diagram showing a structure of a switch 24.

FIG. 7 shows a structure of the switch 24. The switch 24 comprises a first switch section 24a and a second switch section 24b and selects and outputs either one of two stand-by signals including a WHITE signal and a BLACK signal or a video signal for normal display of 64 levels which is the output of the DAC 20.

The first switch section 24a is switched by a mode signal which indicates a normal mode or a stand-by mode (low power mode) and selects and outputs the video signal for normal display during a normal mode.

During a stand-by mode, on the other hand, the first switch section 24a selects a stand-by signal. An output of the second switch section 24b is supplied to an input terminal of the first switch 24a for stand-by signal. The second switch section 24b selects and outputs one of the WHITE signal and the BLACK signal. Therefore, during a stand-by mode, the WHITE signal or the BLACK signal selected by the second switch section 24b is output through the first switch section 24a.

An MSB (most significant bit; fifth bit of bits 0-5) in the 6-bit output of the SRAM 18 is supplied to the second switch section 24b. This is because the display is a display of a simple symbol or the like during the stand-by mode, two types of displays including black and white are used during the stand-by mode, and the fifth bit of the video data determines whether the display should be black or white. When black is "000000" and white is "111111", for example, it is possible to determine black or white using any bit, but because some video data do not use the full range of data, the determination should be made using a suitable bit. In other words, it is determined for each pixel whether the data for the pixel is white or black based on a suitable bit in the pixel data and the second switch section 24b selects one of the WHITE signal and the BLACK signal. In addition, in the exemplified configuration, a predetermined bit of the SRAM 18 is used as a switch control signal and is supplied to the first switch section 24a so that the first switch section 24a is switched based on the bit being "1" or "0".

In this manner, a normal video signal from the DAC 20 is supplied to the data line DL during the normal display mode and one of the WHITE signal and the BLACK signal is supplied to the data line DL during the stand-by mode.

In full-color display devices having pixels of R, G, and B colors also, the display itself is made white by supplying a high brightness signal to all pixels, and is made black by supplying a low brightness signal to all pixels. Because each of the pixels of R, G, and B colors can be switched ON and OFF, it is also possible to display in 8 colors including R, G, B, R+G, R+B, G+B, white, and black.

During a stand-by mode, the video signal of multi levels for normal display is not necessary. Therefore, in the present embodiment, by selecting a WHITE signal or a BLACK signal which is separately prepared using the digital video data, the analog video signal is not used, operations of the DAC 20 and the amplifier 22 are stopped, and the power consumption is reduced. Regarding the amplifier 22, it is preferable for the power supply of the amplifier 22 to be switched OFF. Similarly, regarding the DAC, it is preferable for the power supply of the amplifier for generating the reference voltage for the DAC to be switched OFF. In this manner, during the stand-by mode, because the processes for analog signals are not necessary, the power consumption can be reduced by completely stopping the operations of the analog circuits.

In liquid crystal display devices, an AC driving process is applied in which the application direction of the voltage to the liquid crystal is periodically inverted at a predetermined period for purposes of prevention of image persistence or the like. Therefore, when a normally black liquid crystal (which shows black display when no voltage is applied) is to be used, the BLACK signal is set as a constant voltage similar to the voltage on the supply electrode and the WHITE signal is set at a voltage which significantly differs from that on the common electrode every predetermined period. In normally white liquid crystal display devices (which show white display when no voltage is applied), the signals are opposite to those in the normally black liquid crystal display devices.

Figure 8:
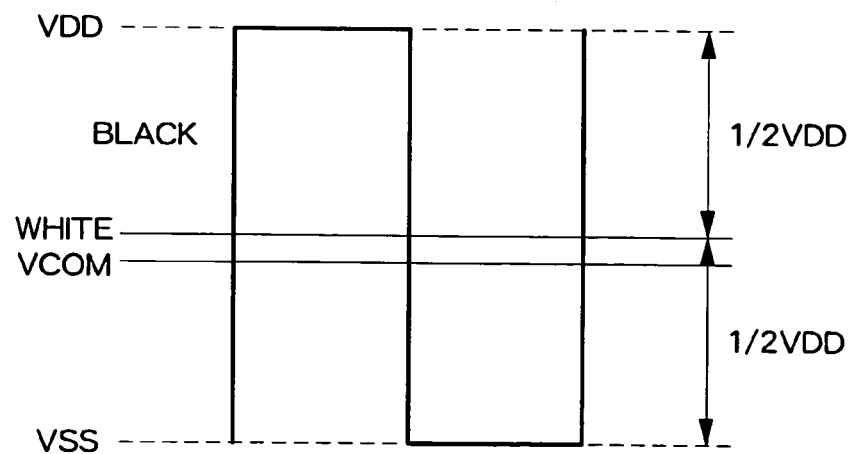
FIG. 8 is a diagram showing waveforms of a WHITE signal and of a BLACK signal.

In the case of the normally white device, as shown in FIG. 8, for example, the WHITE signal is a signal of ½ VDD and the BLACK signal is a signal in which VSS and VDD alternately repeat every horizontal scan period. These voltages are applied to the pixel electrode of the liquid crystal element. A voltage VCOM on the common electrode is set at a voltage which is approximately equal to that of the WHITE signal. In this manner, the polarity (whether the voltage is larger than or smaller than VCOM) of the video signal to be supplied to the pixels of the black display in every row of pixels is inverted. Because the polarity of the video signal for this row is inverted at the next frame, the voltage application direction with respect to the liquid crystal is inverted every frame for pixels which continue to display black.

In particular, the dot inversion method as described above is preferable in which the direction of voltage to be applied to the liquid crystal is inverted for each dot within the row.

[Specific Circuit Structure of Switch 24]

Figure 9:
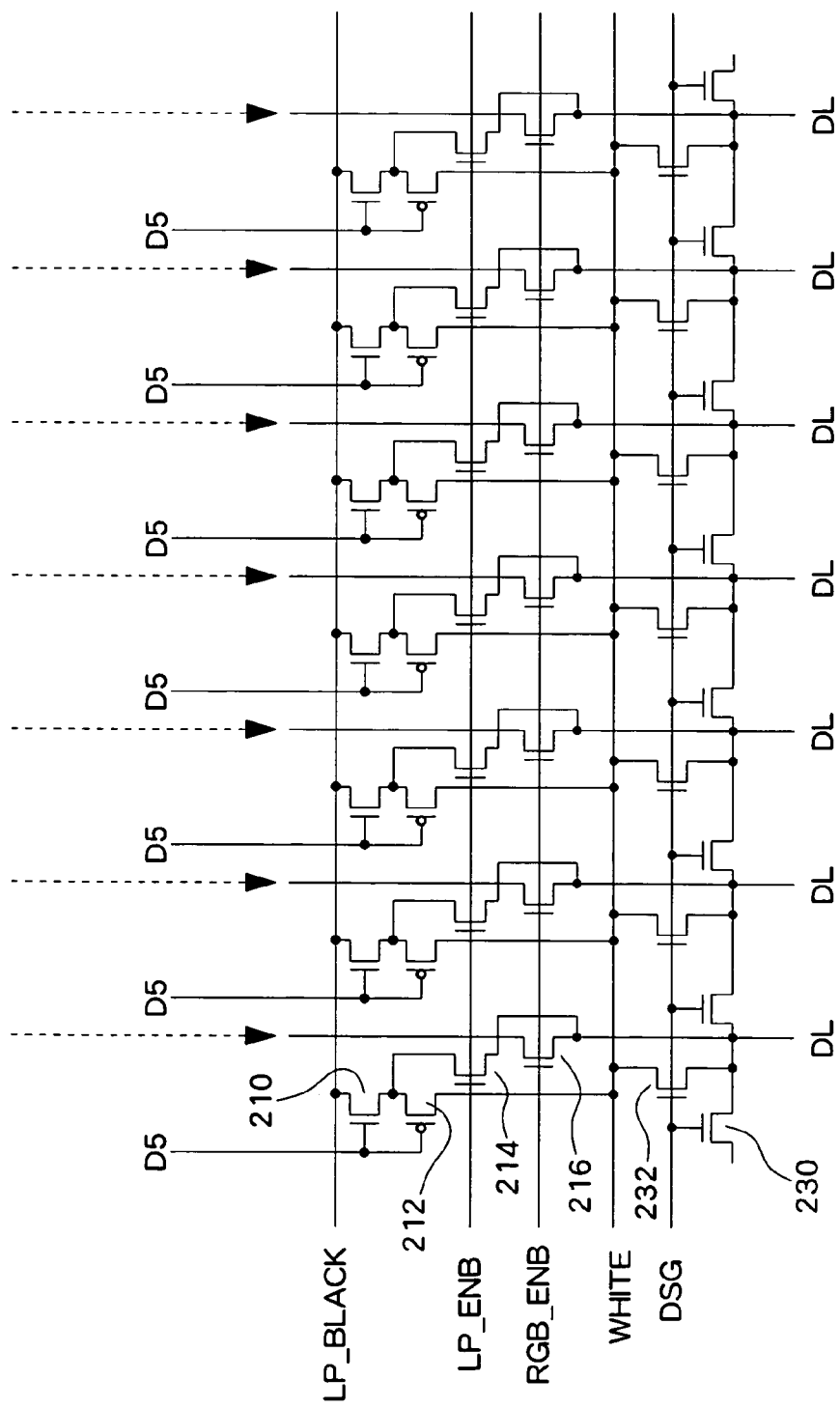
FIG. 9 is a diagram showing a structure for precharge of a data line.

FIG. 9 shows a specific circuit structure of the switch 24. A BLACK signal (LP_BLACK) is supplied to one terminal (a drain or a source) of a TFT 210, one terminal (a source or a drain) of a p-channel TFT 212 is connected to the other terminal (the source or the drain) of the n-channel TFT 210, and a WHITE signal (WHITE) is supplied to the other terminal (the drain or the source) of the p-channel TFT 212. A fifth bit of the video data (D5) is supplied to gates of the TFTs 210 and 212. Therefore, the TFT 210 is switched ON when D5 is "1" and the TFT 212 is switched ON when D5 is "0".

One terminal of an n-channel TFT 214 is connected to the connection point between the TFT 210 and the TFT 212 and the other terminal of the TFT 214 is connected to the data line DL. An LP_ENB signal which is set to the H level during the stand-by mode is supplied to a gate of the TFT 214. Therefore, during the stand-by mode, the TFT 214 is switched ON and one of the BLACK signal and the WHITE signal is supplied to the data line DL.

An analog video signal of 64 levels which is supplied from the DAC 20 via the amplifier 22 is supplied to one terminal of an n-channel TFT 216 and the other terminal of the TFT 216 is connected to the data line DL. An RGB_ENB signal which is set to the H level during the normal display mode is supplied to a gate of the TFT 216. Therefore, during the normal display mode, the TFT 216 is switched ON and a video signal of 64 levels is supplied to the data line DL.

In this manner, one of the WHITE signal and the BLACK signal is selected by the video data D5, either the video signal or one of the WHITE signal and BLACK signal is selected by the LP_ENB signal and the RGB_ENGB signal, and the selected signal is supplied to the data line DL.

[Structure of Precharge]

FIG. 9 also shows a structure for precharging the data line DL. Specifically, an n-channel TFT 230 is provided between the data lines DL so that adjacent data lines DL are connected to each other by switching the TFT 230 ON. The TFT 230 is provided between every data line DL. In addition, an n-channel TFT 232 is provided between the line for supplying the WHITE signal and the data line DL and the WHITE signal is supplied to the data line DL by switching the TFT 232 ON.

A DSG signal is supplied to gates of the two TFTs including the TFT 230 and the TFT 232. Therefore, both of the TFTs 230 and 232 are switched ON when the signal DSG is set to the H level so that the adjacent data lines DL are connected to each other and the WHITE signal is supplied to the data lines.

As shown in FIG. 8, the WHITE signal is a signal of (½)VDD. Therefore, it is possible to precharge each data line DL to a voltage of (½)VDD by setting the DSG signal to the H level during a horizontal return period. The precharge process is performed before the data in one horizontal scan period is set to the data line DL such as, for example, the horizontal return period.

In particular, in a dot inversion method to be described later in which the polarity of the data is inverted between adjacent pixels (dots), the voltage values of the video signals to be set to the adjacent data lines DL are of opposite directions with respect to the voltage VCOM on the common electrode. Therefore, by switching the TFT 230 ON and connecting the adjacent data lines DL, it is possible to set the voltages on the data lines DL to a voltage near the voltage VCOM on the common electrode. More specifically, in display of a natural image or the like, the brightness in adjacent pixels are often close to each other and therefore, by connecting the data lines DL which are set to voltages for display in adjacent pixels, it is possible to set the voltage to a voltage near VCOM without supplying any power from the outside. For example, in a display of black on the entire screen, the data lines DL are alternately set at VSS and VDD, and the precharge process can be efficiently applied by connecting the data lines.

In addition, in the present embodiment, the TFT 232 is provided and the data line DL is set to (½)VDD. With this process, the power (amount of charge) necessary for writing the video signal to the data line DL after the precharge is reduced and power consumption can be reduced.

In the example configuration of FIG. 9, the TFTs 230 and 232 are switched ON and OFF with the DSG signal of one control line, and thus the TFTs 230 and 232 are switched ON at the same timing. The present invention, however, is not limited to such a configuration and it is also preferable to employ a configuration, for example, in which separate control lines are provided and the TFT 232 is switched ON after the TFT 230 is switched ON. In addition, although the voltage to be supplied by the TFT 232 is exemplified as (½)VDD, the voltage is not limited to this voltage and other voltages may be used as long as the voltage is close to the voltage VCOM on the common electrode.

When the TFT 230 is provided, it is also possible to omit the TFT 232. In other words, it is possible to connect the adjacent data lines DL through the TFT 230 by switching the TFT 230 ON, and similar advantage can be obtained with such a configuration. It is also possible to provide only one of the TFT 230 and TFT 232.

[Pixel Circuit and Dot Inversion]

It is preferable to employ a configuration in which two capacitor lines are provided for each row, voltages of opposite polarities are supplied to the two capacitor lines, and the polarity of the voltage on each capacitor line is inverted every frame. A structure of such a configuration will now be described.

Figure 10:
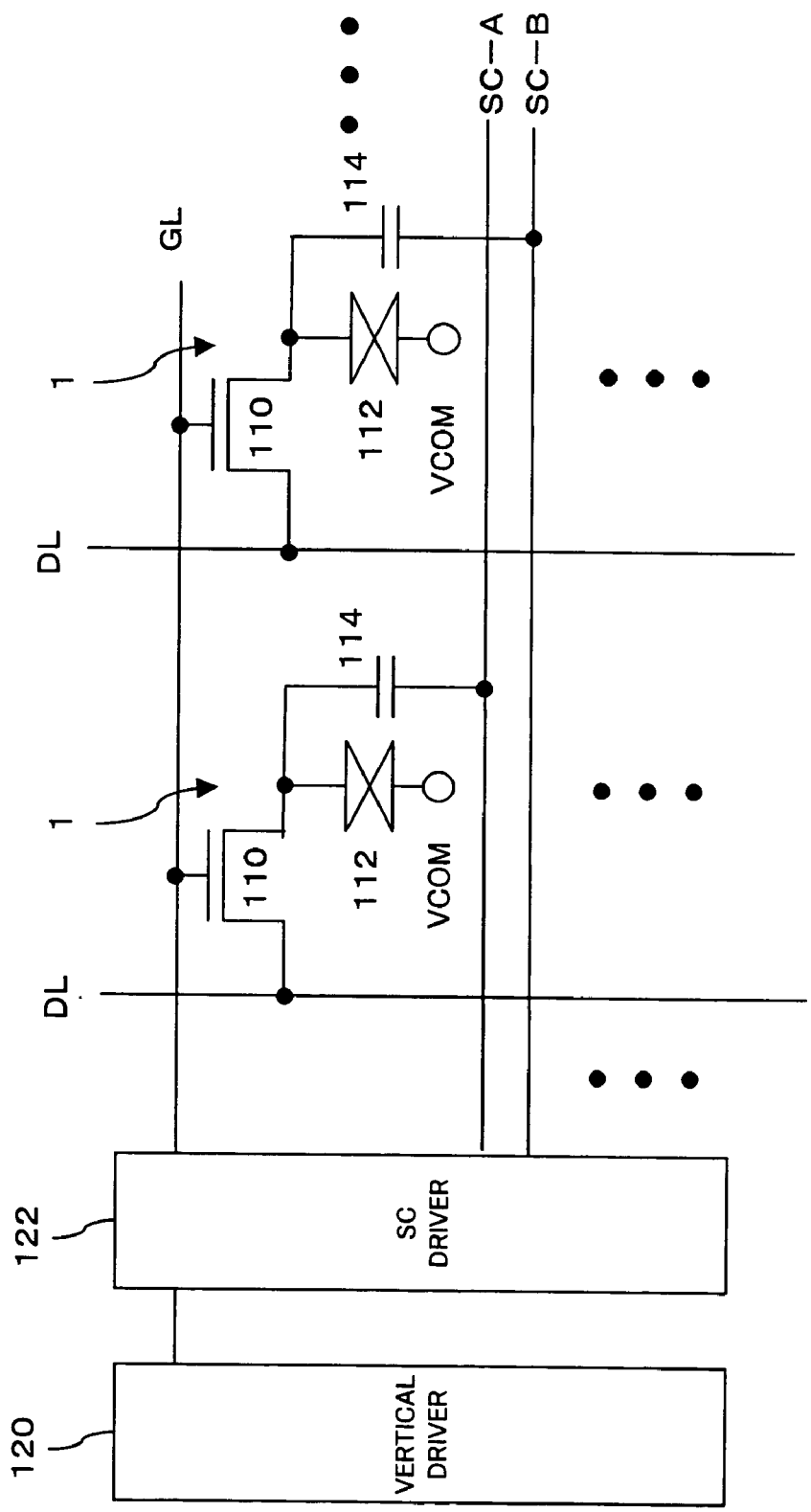
FIG. 10 is a diagram schematically showing a structure of a pixel circuit in which two capacitor lines are provided.

FIG. 10 schematically shows a structure of a pixel circuit in which two capacitor lines are provided. Pixel circuits 1 are placed over the entire display region in a matrix form. The matrix form does not need to be a complete grid pattern and may alternatively be a zigzag shape. The display may be of monochrome or of full-color. In the case of a full-color display, the pixels normally include three colors of R, G, and B, but it is also preferable to add a pixel of a particular color including white as necessary.

As shown in FIG. 10, each pixel circuit 1 comprises an n-channel pixel TFT 110 having a source connected to the data line DL, a liquid crystal element 112 connected to a drain of the pixel TFT 110, and a storage capacitor 114 also connected to the drain of the pixel TFT 110. A gate line GL placed for each horizontal scan line is connected to a gate of the pixel TFT 110.

A pixel electrode provided individually for each pixel is connected to the drain of the pixel TFT 110 and the liquid crystal element 112 is formed by placing a common electrode common to all pixels opposing the pixel electrode with liquid crystal therebetween. The common electrode is connected to a common electrode power supply VCOM.

An extended portion of a semiconductor layer forming the drain of the pixel TFT 110 forms one electrode of the storage capacitor 114 and a portion of a capacitor line SC formed opposing the one electrode with an oxide film therebetween forms an opposing electrode. Alternatively, it is also possible to form the portion to be the electrode of the storage capacitor 114 using a separate semiconductor layer different from the portion of the pixel TFT 110 and connect the two portions by a metal line.

The capacitor line SC includes capacitor lines SC-A and SC-B for each row (horizontal scan line). The storage capacitors in the pixel circuits along the horizontal scan direction are alternately connected to the capacitor lines SC-A and SC-B. In the pixel circuit of FIG. 10, the storage capacitor 114 is connected to the capacitor line SC-A and the storage capacitor 114 of the adjacent pixel is connected to the capacitor line SC-B.

A vertical driver 120 is connected to the gate line GL, which sequentially selects one of the gate lines GL every horizontal period and sets the selected gate line GL to the H level. The vertical driver 120 has a shift register. When a signal STV indicating the start of a vertical scan period is received, a first stage of the shift register is set to the H level and the H level is then shifted through each stage by a clock signal, for example, so that the gate lines GL of the horizontal scan lines are sequentially selected one by one and set to the H level. Here, the H level of the gate line GL is, for example, at the VDD potential, the L level is at the VSS potential, and the power supply voltages VDD and VSS are supplied to the vertical driver 120. In this manner, the H level and the L level of the gate line GL which are the output of the vertical driver 120 are set.

An SC driver 122 outputs two voltage levels to the two storage capacitor lines SC-A and SC-B.

Although not shown in the figure, a horizontal driver, for example, is also provided in a display device and controls a line sequential supply of an input video signal to the data line DL. In other words, in the exemplified configuration, the horizontal driver outputs a sampling clock for each pixel according to the clock of the video signal for each pixel and the switch is switched ON and OFF by the sampling clock to latch the video signals (data signals) for one horizontal scan line. Then, the latched data signals for the pixels of the horizontal scan line are output to the data line DL for one horizontal scan period.

In reality, the video signals include three signals for R, G, and B and the pixels along the vertical direction are pixels of the same color of one of R, G, and B. Therefore, the data signal for one color of R, G, and B is set to the data line DL.

In the device of the present embodiment, a dot inversion AC application method is employed. More specifically, in each pixel along the horizontal scan direction (dot), the voltage to be applied to the pixel electrode of the liquid crystal element 112 is applied as a data signal having an opposite polarity with respect to the voltage VCOM of the common electrode.

Figure 11:
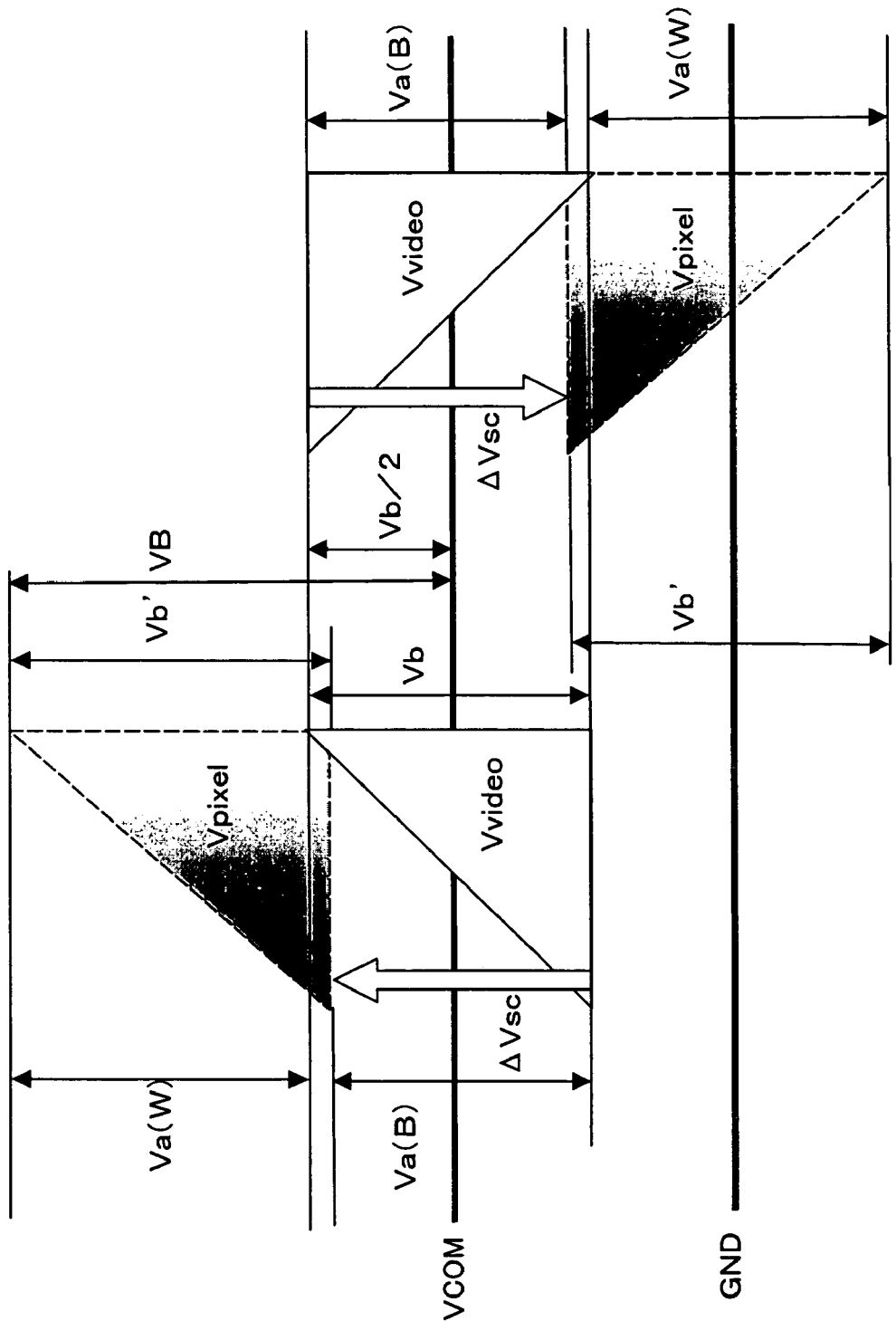
FIG. 11 is a diagram for explaining a voltage application state with respect to liquid crystal.

A data signal shown on the left side of FIG. 11 is a data signal having a first polarity, and a hypotenuse of a triangle labeled Vvideo indicates a data signal (written voltage) corresponding to brightness. The data signal has a potential difference (dynamic range) of Vb between the black level and the white level, and the voltage applied to the pixel electrode after voltage shift is apart from the VCOM for white and close to VCOM for black. Therefore, in the example configuration, the black level is VCOM−Vb/2 and the white level is VCOM+Vb/2. In the adjacent pixel, as shown in the right side of FIG. 11, the polarity is a second polarity opposite to the first polarity, and thus the black level is VCOM+Vb/2 and the white level is VCOM−Vb/2.

Figure 12:
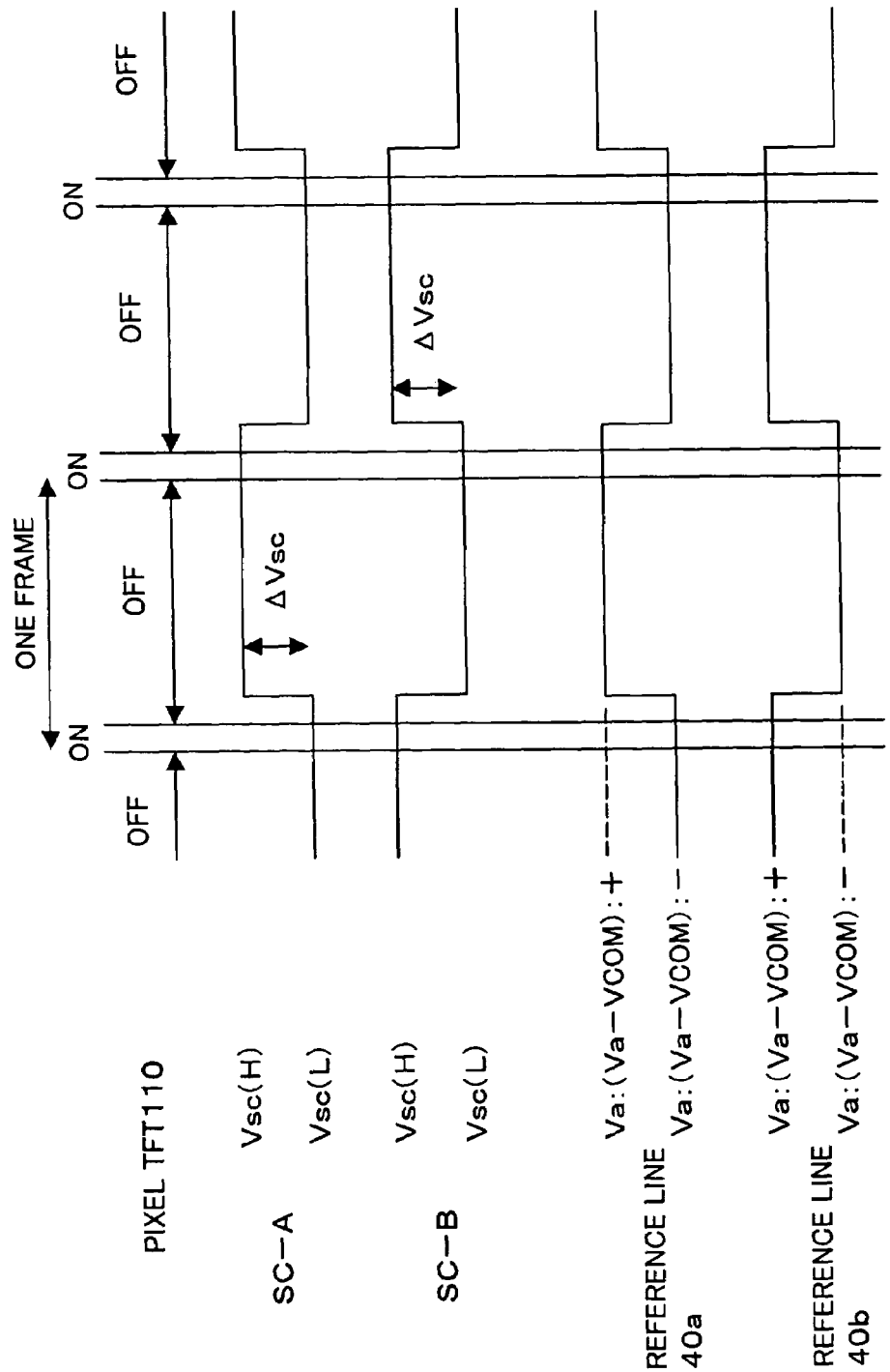
FIG. 12 is a diagram showing waveforms of various signals.

As shown in FIG. 12, after the ON period to the pixel TFT 110 is completed and data writing is completed, voltages on the capacitor lines SC-A and SC-B are shifted by a predetermined voltage □Vsc. In this example configuration, normally black, vertical alignment (VA) liquid crystal is used as the liquid crystal. The capacitor line SC-A is connected to the pixel at the left side of FIG. 11, and Vsc is shifted in a direction of increasing voltage by □Vsc. On the other hand, the capacitor line SC-B is connected to the pixel at the right side of FIG. 11, and Vsc is shifted in a direction of decreasing voltage by □Vsc.

With this process, as shown in FIG. 12, the data signal applied to the pixel electrode is shifted by a voltage corresponding to □Vsc and the resulting data signal is applied between the pixel electrode and VCOM. □Vsc is set at a voltage corresponding to a threshold voltage Vath in which transmittance corresponding to the application voltage to the liquid crystal starts to change and display by the liquid crystal element 114 is enabled by the shifted voltage. The dynamic range of the data signal is set such that the dynamic range after the shift is a potential difference from the black level to the white level in the display.

In FIG. 11, Va (W) represents an amount of shift of the data signal of white level and Va (B) represents an amount of shift of the data signal of black level, and these amounts of shift are determined according to □Vsc. Vb represents a potential difference between the black level and the white level of the data signal (dynamic range) and Vb' represents a dynamic range after the shift.

[Overall Operation]

The read operation of video data to the SRAMs 16 and 18 in FIG. 1 will now be described based on a timing chart of FIG. 13. A horizontal scan period comprises a data period in which video data is supplied to a video line 10 (FIG. 1) and a horizontal return period (blanking period). Synchronization is realized by a horizontal synchronization signal Hsync in the horizontal scan period. A dot clock Dotclock is a signal which is synchronized to one dot of video data and uses, as a horizontal transfer clock, XCKH (and CKH) which is a horizontal transfer clock having ½ frequency to transfer a horizontal start signal STH to a horizontal transfer register 14 (FIG. 1). An enable signal ENB allows transfer of STH in the horizontal transfer register 14 only during a period in which the video data is supplied.

Figure 13:
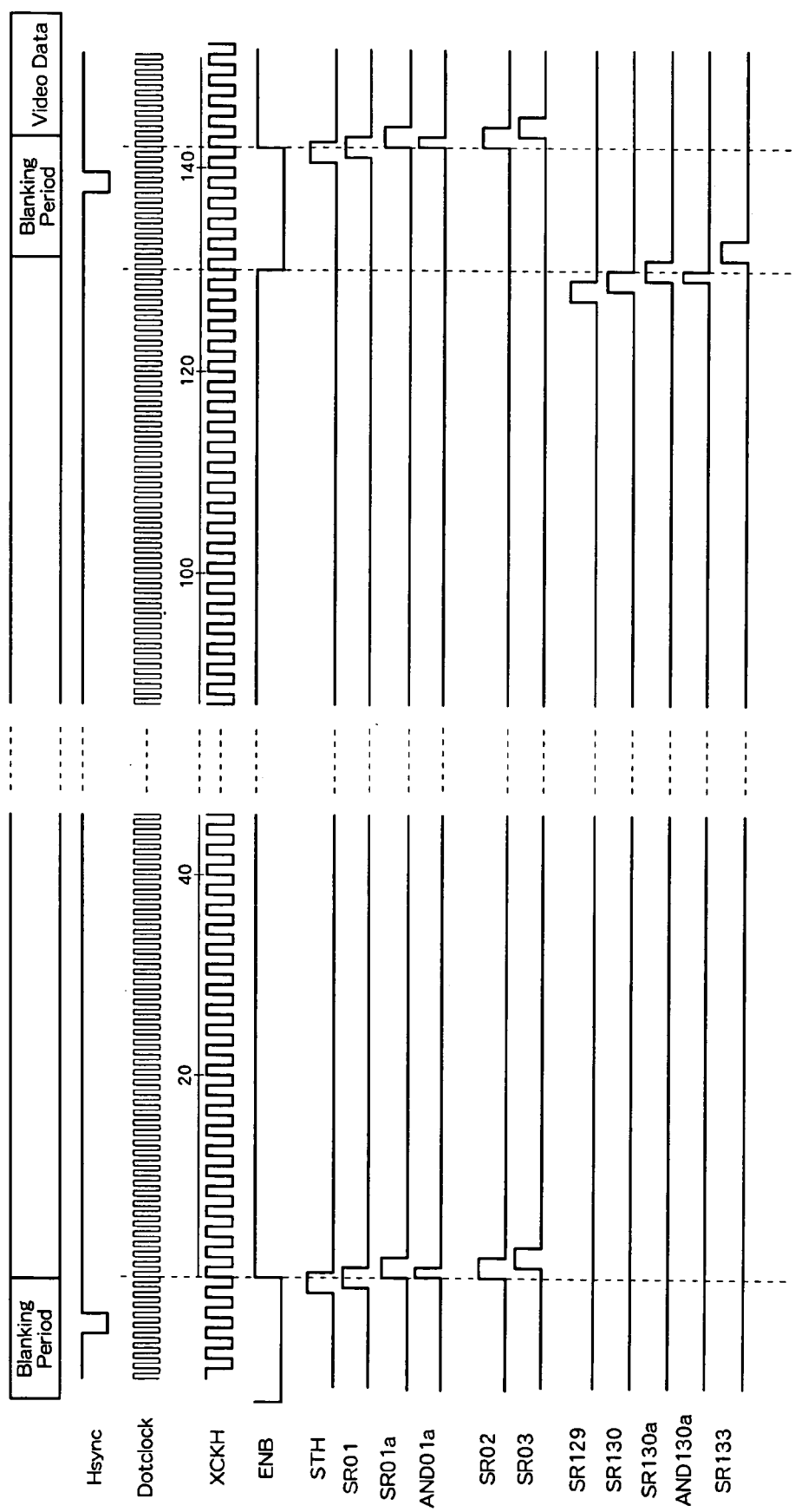
FIG. 13 is a timing chart for reading of video data.

As shown by SR01 in FIG. 13, STH is transferred to a first stage of a horizontal transfer register 14 and is then sequentially transferred to SR02, SR03, etc. In this example configuration, the reading of the video data is completed at the 130th stage. The reading of the video data to the SRAM 16 (FIG. 1) is performed by signals AND01a-AND130a. AND01a is a signal obtained by an AND (logical product) operation of SR01 and SR01a (which is a signal identical to SR02), becomes the H level at a second half of SR01, and corresponds to video data of a first dot of the video data. Therefore, the video data of the first dot is read by the first stage SRAM 16 with the signal AND01a. With the signals AND01a-AND130a, the video data of one row is read by the corresponding SRAMs 16.

In the exemplified configuration, the number of stages of the horizontal transfer register 14 is set to 133, and with SR133, the video data of one row read to the SRAM 16 is transferred to SRAM 18.

Figure 14:
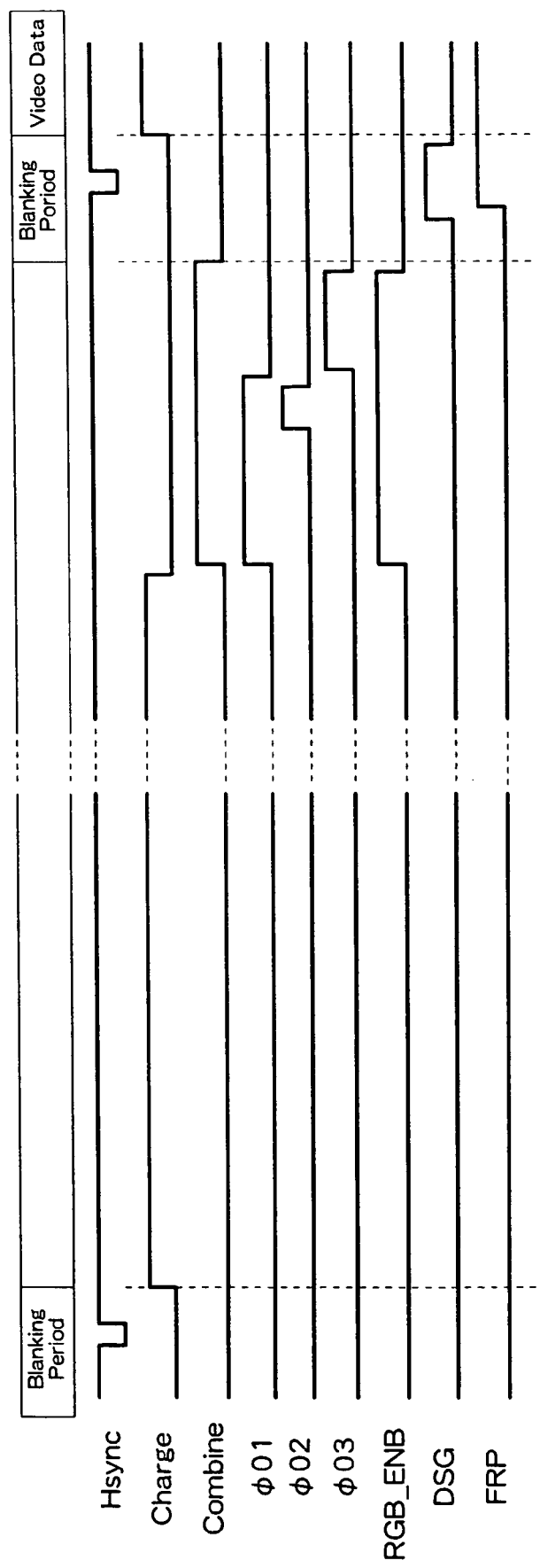
FIG. 14 is a timing chart for outputting an analog video signal.

Next, a write operation from the DAC 20 to the pixel circuit 100 will be described based on a timing chart of FIG. 14.

When the blanking period is completed, video data of one row is set in the SRAM 18 as described above. Although the DAC 20 performs the digital-to-analog conversion, the capacitor 430 must be charged regarding the lower 3 bits, and thus the signal Charge is set to the H level to start charging. After the charging is completed, the signal Charge is set to the L level and the signal Combine is set to the H level. With this process, an analog video signal of 64 levels is obtained at the output of the DAC 20.

During the period when an analog signal is output from the DAC 20, the output correction process of the amplifier 22 as described above is performed. In this description, the timings of signals φ01-φ03 used in the structure of FIG. 4 are shown, which are equal to those shown in FIG. 5A.

The signal φ supplied to the gate of the switching TFT in FIG. 5C becomes the H level at a timing similar to that of the signal φ03.

In the switch 24, on the other hand, the signal RGB_ENB is set to the H level during the period in which the signal Combine is at the H level so that the analog video signal which is an output of the amplifier 24 is supplied to the data line DL, and the pixel circuit 100 of the corresponding row reads the analog video signal. The signal RGB_ENB returns to the L level before the signal Combine does so that a change in the video signal on the data line DL is prevented.

The gate line GL becomes the H level in the data period. In each pixel circuit 100, the gate line GL becomes the H level at a later portion of the period in which the signal RGB_ENB is at the H level and the data voltage in the pixel circuit 100 is fixed.

On the other hand, during the blanking period, the signal DSG becomes the H level and the data lines DL are precharged to a voltage of (½)VDD. In addition, because the signal FRP is inverted during the blanking period, the polarity of the reference voltage in the DAC 20 is inverted and the polarity of the analog video data is inverted.

What is claimed is:

1. A digital-to-analog converter circuit comprising: a plurality of capacitors each provided corresponding to each bit of digital data and having different capacitances from each other which are determined based on weights of the corresponding bits;

an output unit which outputs an analog voltage determined based on an amount of charge which is a total of charges charged to the plurality of capacitors and a total capacitance of the plurality of capacitors; and a charge control transistor which is provided on a route of the digital data to each of the plurality of capacitors and controls supply of a voltage for each bit to the capacitor, wherein the transistor size of the charge control transistor is set corresponding to the capacitance of the capacitor to which the charge control transistor is connected such that the size of the charge control transistor is larger if the capacitor is larger.

2. A digital-to-analog converter circuit comprising: a plurality of capacitors each provided corresponding to each bit of digital data and having different capacitances from each other which are determined based on weights of the corresponding bits; an output unit which outputs an analog voltage determined based on an amount of charge which is a total of charges charged to the plurality of capacitors and a total capacitance of the plurality of capacitors; and a charge control transistor which is provided on a route of the digital data to each of the plurality of capacitors and controls supply of a voltage for each bit to the capacitor, wherein the transistor size of the charge control transistor is set corresponding to the capacitance of the capacitor to which the charge control transistor is connected, wherein the plurality of capacitors each has a first terminal connected to a corresponding charge control transistor and have second terminals commonly connected to a power supply, and the output unit short-circuits a side of the first terminals of the plurality of capacitors and outputs the analog voltage from the first terminals.

3. A digital-to-analog converter circuit comprising: a plurality of capacitors each provided corresponding to each bit of digital data and having different capacitances from each other which are determined based on weights of the corresponding bits; an output unit which outputs an analog voltage determined based on an amount of charge which is a total of charges charged to the plurality of capacitors and a total capacitance of the plurality of capacitors; and a charge control transistor which is provided on a route of the digital data to each of the plurality of capacitors and controls supply of a voltage for each bit to the capacitor, wherein the transistor size of the charge control transistor is set corresponding to the capacitance of the capacitor to which the charge control transistor is connected, wherein the plurality of capacitors each has a first terminal connected to a corresponding charge control transistor, and the output unit sets an identical voltage between both terminals of the plurality of capacitors and then switches the charge control transistor ON so that the analog voltage is output from the second terminals of the plurality of capacitors.

* * * * *